(12) United States Patent
Kubo et al.

(10) Patent No.: US 10,184,176 B2
(45) Date of Patent: Jan. 22, 2019

(54) CUTTING TOOL

(71) Applicant: KYOCERA Corporation, Kyoto-shi, Kyoto (JP)

(72) Inventors: Hayato Kubo, Satsumasendai (JP); Kou Ri, Satsumasendai (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 191 days.

(21) Appl. No.: 15/107,207

(22) PCT Filed: Dec. 25, 2014

(86) PCT No.: PCT/JP2014/084322
§ 371 (c)(1),
(2) Date: Jun. 22, 2016

(87) PCT Pub. No.: WO2015/099047
PCT Pub. Date: Jul. 2, 2015

(65) Prior Publication Data
US 2017/0029944 A1 Feb. 2, 2017

(30) Foreign Application Priority Data

Dec. 26, 2013 (JP) ................................. 2013-269421

(51) Int. Cl.
*C23C 16/36* (2006.01)
*C23C 16/40* (2006.01)
(Continued)

(52) U.S. Cl.
CPC ................ *C23C 16/36* (2013.01); *C23C 8/08* (2013.01); *C23C 8/80* (2013.01); *C23C 10/28* (2013.01);
(Continued)

(58) Field of Classification Search
USPC ........ 428/469, 472, 697, 698, 699, 701, 702
See application file for complete search history.

(56) References Cited

U.S. PATENT DOCUMENTS 5,652,045 A * 7/1997 Nakamura ............. C23C 16/36
428/698
5,915,162 A 6/1999 Uchino et al.
(Continued)

FOREIGN PATENT DOCUMENTS

CN 1256183 A 6/2000
EP 0653499 A1 5/1995
(Continued)

OTHER PUBLICATIONS

Extended European Search Report, European Patent Application No. 14874994.8, dated Jul. 7, 2017, 9 pgs.
(Continued)

*Primary Examiner* — Archene A Turner
(74) *Attorney, Agent, or Firm* — Volpe and Koenig, P.C.

(57) ABSTRACT

A cutting tool comprises a base including a hard alloy and a coating layer located on a surface of the base, wherein the coating layer comprises at least one TiCN layer, an $Al_2O_3$ layer and an outermost layer which are laminated in order from a side of the base, and a content of Cl at a thickness-center position of the TiCN layer is higher than a content of Cl at a thickness-center position of the outermost layer and the content of Cl at the thickness-center position of the outermost layer is higher than a content of Cl at a thickness-center position of the $Al_2O_3$ layer in a glow-discharge emission spectrometry (GDS analysis).

9 Claims, 2 Drawing Sheets

(51) Int. Cl.
  *C23C 8/80* (2006.01)
  *C23C 28/04* (2006.01)
  *C23C 8/08* (2006.01)
  *C23C 10/28* (2006.01)
  *C23C 10/60* (2006.01)
  *C23C 12/02* (2006.01)

(52) U.S. Cl.
  CPC .............. *C23C 10/60* (2013.01); *C23C 12/02* (2013.01); *C23C 16/403* (2013.01); *C23C 28/042* (2013.01); *C23C 28/044* (2013.01); *C23C 28/048* (2013.01)

(56) References Cited

U.S. PATENT DOCUMENTS

| | | | | |
|---|---|---|---|---|
| 5,985,427 | A | * | 11/1999 | Ueda ..................... C23C 16/403 428/702 |
| 6,015,614 | A | | 1/2000 | Ruppi |
| 6,251,508 | B1 | | 6/2001 | Ruppi |
| 6,284,356 | B1 | * | 9/2001 | Kiriyama .............. C23C 30/005 428/699 |
| 6,632,514 | B1 | * | 10/2003 | Sulin ..................... C23C 30/005 428/697 |
| 2010/0255345 | A1 | | 10/2010 | Ban et al. |
| 2013/0052455 | A1 | | 2/2013 | Gates, Jr. et al. |
| 2013/0216777 | A1 | | 8/2013 | Jiang et al. |
| 2014/0227547 | A1 | | 8/2014 | Ri |

FOREIGN PATENT DOCUMENTS

| | | | |
|---|---|---|---|
| EP | 1008673 | A1 | 6/2000 |
| JP | 07-100701 | A | 4/1995 |
| JP | 2004-322226 | A | 11/2004 |
| JP | 2010-03004 | * | 2/2010 |
| JP | 2012-192480 | A | 10/2012 |
| JP | 5214075 | B1 | 6/2013 |
| KR | 2001-0031674 | A | 4/2001 |

OTHER PUBLICATIONS

Korean Office Action with English concise explanation, Korean Patent Application No. 2016-7016526, dated Mar. 25, 2017, 5 pgs.
International Search Report, PCT/JP2014/084322, dated Mar. 31, 2015, 1 pg.
Chinese Office Action with English concise explanation, Chinese Patent Application No. 201480070378.7, dated Apr. 5, 2017, 9 pgs.

* cited by examiner

CUTTING TOOL

TECHNICAL FIELD

The present invention relates to a cutting tool, more specifically a cutting tool including a coating layer.

BACKGROUND ART

Conventionally, as cutting tools widely used for metal cutting work, cutting tools in each of which a coating layer composed of multiple layers such as a TiCN layer and an $Al_2O_3$ layer is formed by deposition on the surface of a base such as a cemented carbide have been widely used. For example, Patent Document 1 discloses that, in a coating layer composed of a TiCN layer and an $Al_2O_3$ layer which are laminated in order from a side of the base, the amount of Cl (chlorine) in the TiCN layer is reduced to 0.05 atom % or less to improve the hardness of the TiCN layer and improve the adhesion of the TiCN layer to the base. Patent Document 2 discloses a small-diameter drill for printed wiring board drilling use, in which chlorine is contained in a Ti-based coating layer formed from TiC, TiN and TiCN to suppress the welding of work materials.

RELATED ART DOCUMENT

Patent Documents

Patent Document 1: Japanese Unexamined Patent Publication No. 07-100701
Patent Document 2: Japanese Unexamined Patent Publication No. 2004-322226

SUMMARY OF THE INVENTION

Problems to be Solved by the Invention

However, the cutting tool disclosed in Patent Document 1, in which the amount of Cl in the TiCN layer is reduced, has a problem that, when the coating layer becomes worn and therefore the $Al_2O_3$ layer becomes ground down to expose the TiCN layer on the surface of the cutting tool, the cutting tool cannot be used for a long period because of poor weld resistance of the TiCN layer. In the drill disclosed in Patent Document 2 which is provided with a chlorine-containing Ti-based coating layer, although weld resistance is improved, the hardness of the Ti-based coating layer is deteriorated and therefore the wear resistance of the coating layer is insufficient.

Means for Solving the Problems

A cutting tool according to the present embodiment includes a base including a hard alloy; and a coating layer located on a surface of the base, wherein the coating layer includes at least one TiCN layer formed from $Ti(C_{x1}N_{y1}O_{z1})$ ($0<x1\leq1$, $0<y1\leq1$, $0\leq z1\leq1$, $x1+y1+z1=1$), an $Al_2O_3$ layer and an outermost layer formed from $Ti(C_{x2}N_{y2}O_{z2})$ ($0\leq x2\leq1$, $0\leq y2\leq1$, $0\leq z2\leq1$, $x2+y2+z2=1$) which are laminated in order from a side of the base, and a content of Cl at a thickness-center position of the TiCN layer is higher than a content of Cl at a thickness-center position of the outermost layer and a content of Cl at the thickness-center position of the outermost layer is higher than the content of Cl at a thickness-center position of the $Al_2O_3$ layer in a glow-discharge emission spectrometry (GDS analysis).

Effects of the Invention

According to the cutting tool of the present embodiment, it becomes possible to improve the wear resistance of the cutting tool and therefore it becomes possible for the cutting tool to be used for a long period.

EMBODIMENTS FOR CARRYING OUT THE INVENTION

Figure 1A:
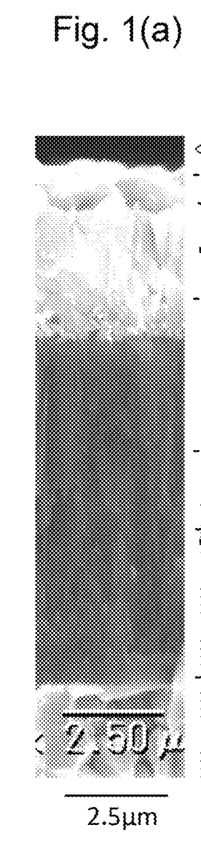
FIG. 1(a) and FIG. 1(b) are respectively a scanning electron microscope (SEM) photograph and a glow-discharge emission spectrometry (GDS analysis) data for a cross section including a surface of a cutting tool according to the present embodiment, which are arranged side by side.
Figure 1B:
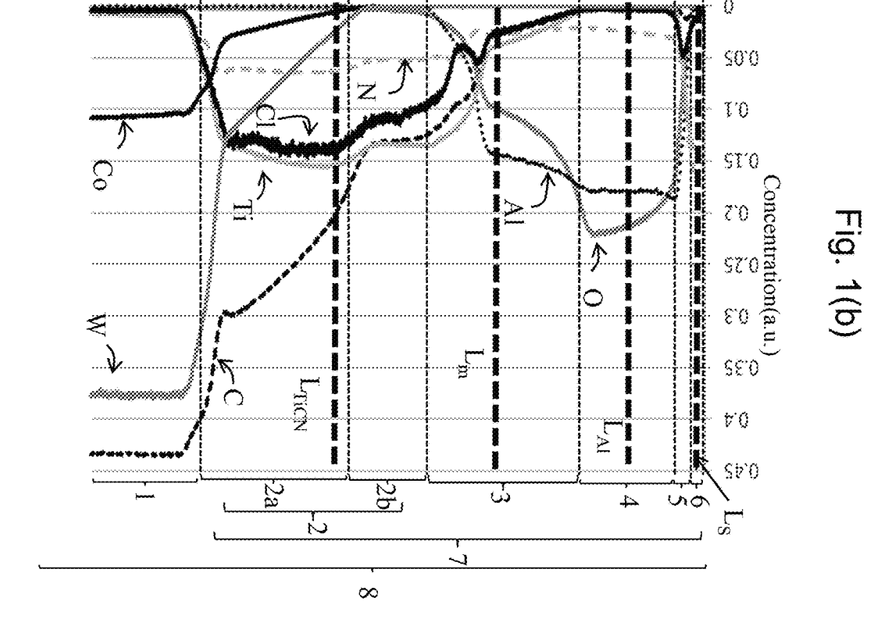

A cutting tool according to the present embodiment is described. FIG. 1(a) is a scanning electron microscope (SEM) photograph for a cross section including a coating layer of the cutting tool, and FIG. 1(b) shows a glow-discharge emission spectrometry (GDS analysis) for the depth direction from the surface of the coating layer. Further, FIG. 2 is a partial enlarged view for checking the distribution of minor components in the GDS analysis data shown in FIG. 1.

According to the present embodiment, the cutting tool 8 includes a base 1 including a hard alloy and a coating layer 7 located on a surface of the base 1, wherein the coating layer 7 includes at least one TiCN layer 2 formed from $Ti(C_{x1}N_{y1}O_{z1})$ ($0<x1\leq1$, $0<y1\leq1$, $0\leq z1\leq1$, $x1+y1+z1=1$), an $Al_2O_3$ layer 4 and an outermost layer 6 formed from $Ti(C_{x2}N_{y2}O_{z2})$ ($0\leq x2\leq1$, $0\leq y2\leq1$, $0\leq z2\leq1$, $x2+y2+z2=1$) which are laminated in order from a side of the base.

Figure 2:
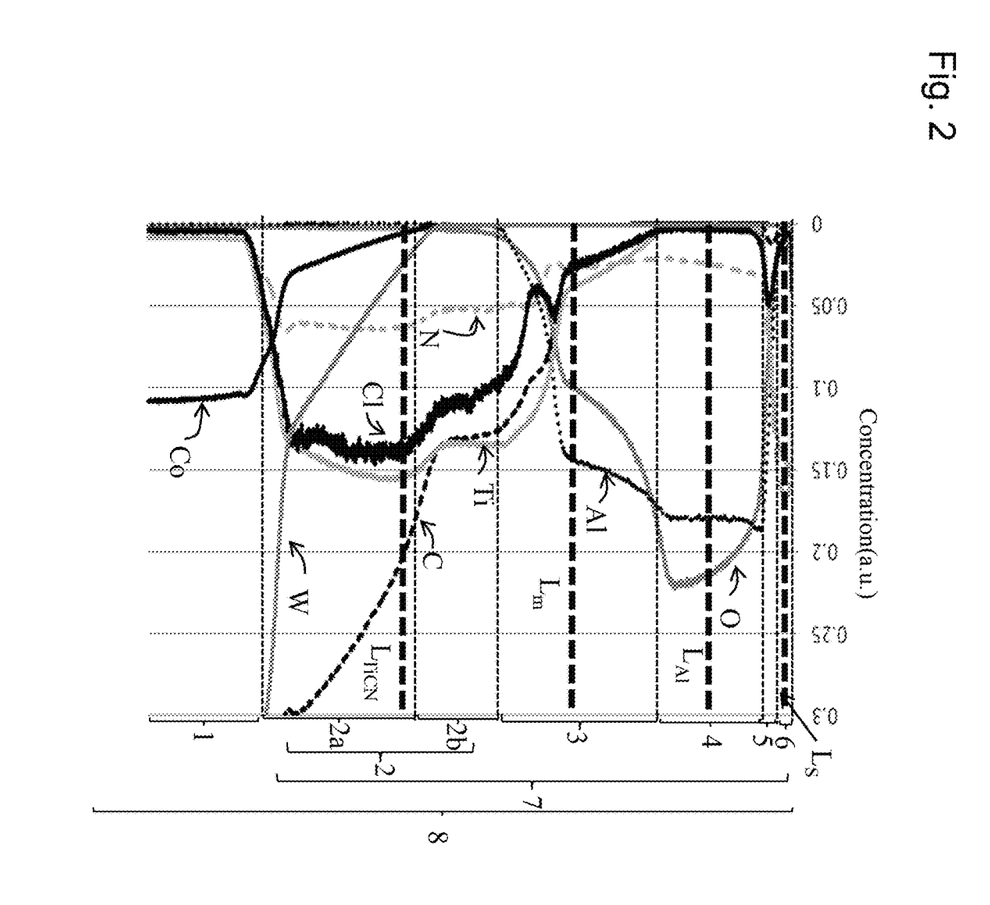
FIG. 2 is an enlarged view for checking the distribution of minor components in the GDS analysis data shown in FIG. 1 (b).

In FIGS. 1 and 2, the compositions of the respective layers, which are determined by the correspondence between the distribution of the respective elements and the electron micrograph (SEM). Reference numeral 1 denotes a base (a cemented carbide), reference numeral 2 denotes a TiCN layer, reference numeral 2a denotes a first TiCN layer, reference numeral 2b denotes a second TiCN layer, reference numeral 3 denotes a first intermediate layer, reference numeral 4 denotes an $Al_2O_3$ layer, reference numeral 5 denotes a second intermediate layer, reference numeral 6 denotes an outermost layer, reference numeral 7 denotes a coating layer including a laminate of the above-mentioned layers, and reference numeral 8 denotes a cutting tool. In FIG. 1, a portion of the cutting tool 8 is illustrated. In the present embodiment, the first intermediate layer 3 is composed of a (Ti,Al)CNO layer, the second intermediate layer 5 is composed of a TiCN layer, and the outermost layer 6 is composed of TiN.

It is to be noted that the first intermediate layer 3 and the second intermediate layer 5 can be omitted. In the present embodiment, the CN ratios in the respective layers of the first TiCN layer 2a and the second TiCN layer 2a both formed from TiCN and the second intermediate layer 5 are different from one another.

In this regard, while the thickness of the respective layers can be calculated in the GDS analysis, thickness errors of the respective layers are increased when etching rate is different for every layer. Thus, the ranges of the respective layers were determined by confirming the compositions of the respective layers and, at the same time, by confirming the peak shapes of the GDS analysis data while checking the scanning electron microscope (SEM) photograph and electron probe microanalysis (EPMA) data (not shown). It is to be noted that as can be seen from the SEM photograph shown in FIG. 1(a), the thicknesses of the respective layers in the SEM photograph are partially not proportional to the thicknesses of the respective layers, which are detected by the GDS analysis. In addition, in the SEM photograph in FIG. 1(a), it can be confirmed that the first TiCN layer 2a in the TiCN layer 2 has the largest film thickness and the $Al_2O_3$ layer 4 has the next largest film thickness in the coating layer 7. From the peak shapes of the GDS analysis data shown in FIG. 1(b), it can be confirmed that there are a region where the Ti distribution remains at a high concentration and a region where the Al distribution remains at a high concentration. Further, the region where the Ti distribution remains at a high concentration is identified as a region of the first TiCN layer 2a and a region of the second TiCN layer 2a, whereas the region where the Al distribution remains at high concentration is identified as a region of the $Al_2O_3$ layer 4. Further, the thickness-center position in the thickness of the TiCN layer 2, i.e., the total thickness of the first TiCN layer 2a and the second TiCN layer 2b, is identified as a center $L_{TiCN}$ of the TiCN layer 2, and the thickness-center position of the $Al_2O_3$ layer 4 is identified as a center $L_{Al}$ of the $Al_2O_3$ layer 4. As for the first intermediate layer 3 and the outermost layer 6, the regions of these layers are determined by the identification of the region of the TiCN layer 2 composed of the first TiCN layer 2a and the second TiCN layer 2b and the region of the $Al_2O_3$ layer 4, and the center positions of the first intermediate layer 3 and the outermost layer 6 are identified as a center position $L_m$ and a center position $L_s$, respectively. The center position of the second intermediate layer 5 is identified in the same manner, but the statement about this center position is omitted in the description.

In this regard, the boundaries between the corresponding layers are regarded as flexion points at which the contents of the respective elements change sharply. However, at boundaries where points at which the contents of the respective elements change sharply are not able to be determined accurately, the boundaries between the corresponding layers are identified by the following method. That is, the boundary between the region of the first TiCN layer 2a and the region of the second TiCN layer 2b is defined as a point at which the content of Ti is 10% lower with respect to the maximum of the Ti content in the region of the first TiCN layer 2a. Likewise, the boundary between the region of the second TiCN layer 2b and the region of the first intermediate layer 3 is defined as a point at which the content of Ti is 10% lower with respect to the maximum of the Ti content in the region of the second TiCN layer 2b. In addition, the boundary between the region of the first intermediate layer 3 and the region of the $Al_2O_3$ layer 4 is defined as a point at which the content of Al is 10% lower with respect to the maximum of the Al content in the $Al_2O_3$ layer 4. Likewise, the boundary between the region of the $Al_2O_3$ layer 4 and the region of the second intermediate layer 5 is defined as a point at which the content of Al is 90% lower with respect to the maximum of the Al content in the $Al_2O_3$ layer 4. Likewise, the boundary between the region of the second intermediate layer 5 and the region of the outermost layer 6 is defined as a point at which the content of Cl is 90% lower with respect to the maximum of the Cl content in the second intermediate layer 5.

In addition, in the GDS analysis, the coating layer has a wide measurement field on the order of about 1 mm in an in-plane direction, and thus, when depressions and protrusions exist between each of the layers, components in other layers adjacent to the respective layers may be mixed and detected. In addition, depending on differences in etching rate between each of the layers, the components contained in the base 1 are mixed in the region identified as the first TiCN layer 2a on the side closer to the base in the GDS analysis. In addition, the components contained in the TiCN layer 2 as a lower layer are mixed in the region identified as the first intermediate layer 3 on the side closer to the base, and the components contained in the $Al_2O_3$ layer 4 as an upper layer are mixed and detected in the region identified as the first intermediate layer 3 on a side of the surface. As a result, the region of the first intermediate layer 3 in the GDS analysis is observed widely more than the actual thickness observed in the SEM photograph.

In this regard, a preferred example of the base 1 is formed from a WC phase, a binder phase, and if necessary, a B1-type solid solution phase. Further, the base of this example contains WC in a proportion of 80 to 94 mass %, Co in a proportion of 5 to 15 mass %, and at least one of a carbide (excluding WC), a nitride and a carbonitride of at least one element selected from the group consisting of metals in Groups 4, 5, and 6 on the periodic table in a proportion of 0 to 10 mass %.

According to the present embodiment, the coating layer 7 composed of the TiCN layer 2, the first intermediate layer 3, the $Al_2O_3$ layer 4, the second intermediate layer 5 and the outermost layer 6 laminated in order from the side of the base 1 is located on the surface of the base 1. In the glow-discharge emission spectrometry (GDS analysis) the glow-discharge emission spectrometry (GDS analysis) shown in FIG. 2, the content of Cl at the thickness-center position of the first TiCN layer 2a in the TiCN layer 2 on the side closer to the base 1 (wherein the content is sometimes abbreviated as a "content of Cl in the first TiCN layer 2a", hereinafter) is higher than the content of Cl at the thickness-center position of the outermost layer 6 (wherein the content is sometimes abbreviated as a "content of Cl in the outermost layer 6", hereinafter), and the content of Cl in the outermost layer 6 is higher than the content of Cl at the thickness-center position of the $Al_2O_3$ layer 4 (wherein the content is sometimes abbreviated as a "content of Cl in the $Al_2O_3$ layer 4", hereinafter).

By employing this constitution, the weld resistance and wear resistance of the TiCN layer 2 that contains Ti, the $Al_2O_3$ layer 4 and the outermost layer 6 can be improved and it becomes possible for the cutting tool 8 to be used for a longer period. That is, according to the cutting tool 8 of the present embodiment, while a trace amount of chlorine (Cl) is present in the base 1 that is formed from a hard alloy such as a cemented carbide and a cermet, Cl is also contained in the coating layer 7 that is to be coated on the surface of the base 1. By controlling the contents of Cl in the respective layers in the coating layer 7, the affinity of the respective layers for a work material and the hardness of the respective layers can be optimized and therefore the weld resistance and wear resistance of the coating layer can be improved. As a result, it becomes possible for the cutting tool 8 to be used for a long period. More specifically, as for the outermost layer 6, because the outermost layer 6 is poor in hardness as a material, the content of Cl in the outermost layer 6 is made smaller than the content of Cl in the TiCN layer 2 for the purpose of mainly achieving the suppression of grinding down of the outermost layer 6. As for the $Al_2O_3$ layer 4, the $Al_2O_3$ layer 4 has high weld resistance as a material because the $Al_2O_3$ layer 4 is an oxide, and therefore the content of Cl in the $Al_2O_3$ layer 4 is made equal to or smaller than the content of Cl in the outermost layer 6 for the purpose of achieving only the improvement of the hardness of the $Al_2O_3$ layer 4. As for the TiCN layer 2, because the TiCN layer 2 has high hardness as a material, the content of Cl in the TiCN layer 2 is made higher than the contents of Cl in the $Al_2O_3$ layer 4 and the outermost layer 6 for the purpose of mainly achieving the improvement of the weld resistance of the TiCN layer 2. By controlling the Cl contents in the respective layers in this manner, the weld resistance and wear resistance of the cutting tool can be totally improved.

When the contents of Cl in the respective layers of the TiCN layer 2, the $Al_2O_3$ layer 4 and the outermost layer 6 are respectively represented by $Cl_{TiCN}$, $Cl_{Al}$ and $Cl_S$, the following requirements are met: $10 \leq Cl_{TiCN} \leq 50$; $0.3 \leq Cl_{Al} \leq 2$; and $2 \leq Cl_S \leq 9.5$. By employing this constitution, it becomes possible to improve the weld resistance and wear resistance of both of the TiCN layer 2 that contains Ti and the outermost layer 6. As a result, it becomes possible for the cutting tool 8 to be used for a longer period.

That is, when the $Cl_{TiCN}$ is smaller than 10 ($Cl_{TiCN} < 10$) and the $Cl_S$ is smaller than 2 ($Cl_S < 2$), the weld resistance of each of the layers is deteriorated. Because unavoidable impurities are also present in the $Al_2O_3$ layer 4, it is difficult to reduce the $Cl_{Al}$ to a value smaller than 0.3. When the $Cl_{TiCN}$ is larger than 50 ($Cl_{TiCN} > 50$), the $Cl_{Al}$ is larger than 2 ($Cl_{Al} > 2$) and the $Cl_S$ is larger than 9.5 ($Cl_S > 9.5$), the wear resistance of each of the layers is deteriorated. The preferred ranges of the content ratios of Cl in the respective layers are as follows: $20 \leq Cl_{TiCN} \leq 35$; $0.3 \leq Cl_{Al} \leq 1.0$; and $2.5 \leq Cl_S \leq 5.5$. The content of Cl in the base 1 can be determined as an average value of the Cl contents in the GDS analysis data as measured in a zone lying between the surface of the base 1 and the depth of 100 μm from the surface.

According to FIGS. 1 and 2, a first intermediate layer 3 is arranged between the TiCN layer 2 and the $Al_2O_3$ layer 4 and a second intermediate layer 5 is arranged between the $Al_2O_3$ layer 4 and the outermost layer 6. The first intermediate layer 3 can improve the adhesion of the TiCN layer 2 to the $Al_2O_3$ layer 4, and can also control crystals in the $Al_2O_3$ layer 4 to form, for example, high-hardness α-type $Al_2O_3$ crystals. The second intermediate layer 5 can improve the adhesion of the $Al_2O_3$ layer 4 to the outermost layer 6, and can also improve the weld resistance of the cutting tool 8 when the outermost layer 6 becomes worn at a relatively early stage.

In the present embodiment, the first intermediate layer 3 is formed from $(Ti,Al)(C_{x3}N_{y3}O_{z3})$ ($0 \leq x3 \leq 1$, $0 \leq y3 \leq 1$, $0 \leq z3 \leq 1$, $x3+y3+z3=1$). The second intermediate layer 5 is formed from $(Ti,Al)(C_{x4}N_{y4}O_{z4})$ ($0 \leq x4 \leq 1$, $0 \leq y4 \leq 1$, $0 \leq z4 \leq 1$, $x4+y4+z4=1$). When the contents of Cl at the thickness-center positions of the respective layers of the first intermediate layer 3 and the second intermediate layer 5 are respectively represented by $Cl_m$ and $Cl_n$, the following requirements are met: $2 \leq Cl_m \leq 9.5$; and $5 \leq Cl_n \leq 25$. This constitution enables the improvement of the weld resistance and wear resistance of the first intermediate layer 3 and the second intermediate layer 5. As a result, it becomes possible for the cutting tool 8 to be used for a longer period. The preferred ranges of $Cl_m$ and $Cl_n$ are as follows: $3 \leq Cl_m \leq 7.5$; and $10 \leq Cl_n \leq 20$. The first intermediate layer 3 is deposited under deposition conditions for generating TiCNO, and can be converted to (Ti,Al)CNO by the action of diffusion of an Al component from the $Al_2O_3$ layer 4 that is formed subsequent to the formation of the first intermediate layer 3.

The second intermediate layer 5 is deposited while increasing the addition amount of HCl in a second mixed gas on a side of the $Al_2O_3$ layer 4. Subsequently, the outermost layer 6 is deposited by flowing a mixed gas for deposition use and the second mixed gas while reducing the amount of HCl to be added to the second mixed gas or by flowing only the first mixed gas. In this manner, Cl is diffused during deposition to form such a concentration distribution that the Cl content in the second intermediate layer 5 is increased and the Cl content in the outermost layer 6 is gradually decreased toward the surface side. Consequently, the adhesion of the outermost layer 6 to the $Al_2O_3$ layer 4 is increased. The distribution of the Cl content in a coating layer 7 that is deposited under the same deposition conditions as those conditions shown in FIGS. 1 and 2 is shown in FIG. 3.

In this regard, W and Co are contained in the coating layer 7. In the present embodiment, when the ratios of the contents of W and Co in the respective layers of the TiCN layer 2, the $Al_2O_3$ layer 4 and the outermost layer 6 to the contents of W and Co in the base 1 are respectively represented by $W_{TiCN}$, $W_{Al}$, $W_S$, $Co_{TiCN}$, $Co_{Al}$ and $Co_S$, the following requirements are met: $0.05 \leq W_{TiCN} \leq 0.3$; $W_{Al} \leq 0.01$; $W_S \leq 0.01$; $0.05 \leq Co_{TiCN} \leq 0.3$; $Co_{Al} \leq 0.01$; and $Co_S \leq 0.01$. More specifically, W and Co which are diffused from the base 1 can diffuse into the TiCN layer 2 to further enhance the adhesion between the base 1 and the coating layer 7. However, W and Co are likely to be oxidized at high temperatures, and therefore hardly diffuse into the $Al_2O_3$ layer 4 and the outermost layer 6, thereby making it possible to suppress the oxidation of the coating layer 7.

In this case, when the ratios of the contents of W and Co in the respective layers of the first intermediate layer 3 and the second intermediate layer 5 are respectively represented by $W_m$, $Co_m$, $W_n$ and $Co_n$, the following requirements are met: $W_m \leq 0.05$; $Co_m \leq 0.05$; $W_n \leq 0.05$; and $Co_n \leq 0.05$. In this case, the adhesion to the coating layer 7 can be increased and the oxidation of the coating layer 7 can be suppressed.

The TiCN layer 2 in the present embodiment has a bilayer laminate structure composed of the first TiCN layer 2a and the second TiCN layer 2b in order from the side of the base 1. However, the TiCN layer may have a single-layer structure or a multilayer structure composed of three or more layers. Alternatively, a TiN layer may be provided between the TiCN layer 2 and the base 1. In the present embodiment, the deposition of the first TiCN layer 2a on the side of the base is carried out under deposition conditions for generating TiN, and therefore a carbon component is diffused from the base 1 to form TiCN. This constitution makes it possible to easily adjust the degrees of diffusion of the respective components of W and Co into the coating layer 7.

(Production Method)

An example of the method for producing a cemented carbide which is a component of the above-described cutting tool according to the present embodiment will be described. First, a WC powder, a metal Co powder, and if necessary, a compound powder containing other metal component are prepared respectively in proportions of: 80 to 94 mass %; 5 to 15 mass %; and 0 to 15 mass %.

These prepared powders are, with the addition of a solvent thereto, subjected to mixing and milling for a predetermined period of time, thereby providing a slurry. This slurry is further mixed with the addition of a wax thereto, and a mixed powder is subjected to granulation while drying the slurry with the use of a spray dryer or the like. Next, with the use of the granulated powder, molding is carried out by press molding into a shape of a cutting tool. Further, after dewaxing in a sintering furnace, the sintering furnace is heated to a sintering temperature of 1380 to 1480° C. and sintered for 1 to 1.5 hours in a reduced atmosphere of 20 to 2000 Pa. In this manner, a cemented carbide can be produced.

Subsequently, a coating layer is formed on the surface of the base by a chemical vapor deposition (CVD) method. According to the present embodiment, a first mixed gas that contains a raw material and a second mixed gas for controlling the content of a Cl component are flown alternately for deposition, thereby adjusting the Cl contents in the respective layers to values falling within desired ranges.

A specific example of the deposition condition will be described. First, a first TiCN layer is formed immediately above the base, if necessary. As for the initial condition for the first TiCN layer, the first TiCN layer is deposited under deposition conditions for forming a TiN (titanium nitride) layer. In this regard, a carbon component is diffused from the base 2 to generate TiCN. Preferred deposition conditions therefor include: the use of a first mixed gas containing, as a mixed gas composition, a titanium tetrachloride ($TiCl_4$) gas in a proportion of 0.5 to 10 volume % and a nitrogen ($N_2$) gas in a proportion of 10 to 60 volume %, and including a hydrogen ($H_2$) gas as a balance and a second mixed gas containing hydrogen chloride (HCl) in a proportion of 1.0 to 10.0 volume % and including a hydrogen ($H_2$) gas as a balance, wherein the first mixed gas and the second mixed gas are flown alternately at time intervals of 10 to 60 seconds; the deposition temperature from 800 to 940° C.; and the pressure from 8 to 50 kPa.

Subsequently, the first TiCN layer is deposited continually. Preferred deposition conditions therefor include: the use of a first mixed gas containing, as a mixed gas composition, a titanium tetrachloride ($TiCl_4$) gas in a proportion of 0.5 to 10 volume %, a nitrogen ($N_2$) gas in a proportion of 1 to 60 volume %, and an acetonitrile ($CH_3CN$) gas in a proportion of 0.1 to 3.0 volume %, and including a hydrogen ($H_2$) gas as a balance and a second mixed gas containing hydrogen chloride (HCl) in a proportion of 1.0 to 10.0 volume % and including hydrogen ($H_2$) gas as a balance, wherein the first mixed gas and the second mixed gas are flown alternately at time intervals of 10 to 60 seconds; the deposition temperature from 780 to 850° C.; and the pressure from 5 to 25 kPa. Under these conditions, an MT (Moderate Temperature)-TiCN layer which is formed from so-called columnar crystals can be deposited. The crystal widths of the columnar crystals can be adjusted by increasing or decreasing the flow rate of the acetonitrile ($CH_3CN$) gas during the deposition.

Subsequently, an HT (High Temperature)-TiCN layer formed from so-called grained crystals is formed as the second TiCN layer. Specifically, subsequent to the formation of the first TiCN layer mentioned above, the HT-TiCN layer is deposited by switching to deposition conditions of: the use of a first mixed gas containing a titanium tetrachloride ($TiCl_4$) gas in a proportion of 0.1 to 3 volume %, a nitrogen ($N_2$) gas in a proportion of 0 to 15 volume %, and a methane ($CH_4$) gas or an acetonitrile ($CH_3CN$) gas in a proportion of 0.1 to 10 volume %, and including a hydrogen ($H_2$) gas as a balance, and a second mixed gas containing hydrogen chloride (HCl) in a proportion of 0.5 to 10.0 volume % and including a hydrogen ($H_2$) gas as a balance, wherein the first mixed gas and the second mixed gas are flown alternately at time intervals of 10 to 60 seconds; the deposition temperature from 900 to 1020° C.; and the pressure from 5 to 40 kPa.

Subsequently, a (Ti,Al)CNO layer is deposited. The (Ti,Al)CNO layer is deposited under deposition conditions for generating TiCNO. A specific example of the deposition conditions includes: the use of a first mixed gas containing a titanium tetrachloride ($TiCl_4$) gas in a proportion of 0.1 to 10 volume %, a nitrogen ($N_2$) gas in a proportion of 1 to 15 volume %, a methane ($CH_4$) gas or an acetonitrile ($CH_3CN$) gas in a proportion of 0.1 to 10 volume %, and a carbon monoxide (CO) gas in a proportion of 0.5 to 3.0 volume %, and including a hydrogen ($H_2$) gas as a balance and a second mixed gas containing hydrogen chloride (HCl) in a proportion of 0.3 to 2.0 volume %, and including a hydrogen ($H_2$) gas as a balance, wherein the first mixed gas and the second mixed gas are flown alternately at time intervals of 10 to 60 seconds; the deposition temperature from 900 to 1020° C.; and the pressure from 5 to 40 kPa. After the deposition, an Al component in an $Al_2O_3$ layer mentioned below is diffused to generate (Ti,Al)CNO.

Subsequently, an $Al_2O_3$ layer is formed. A specific example of the deposition conditions includes: the use of a mixed gas containing an aluminum trichloride ($AlCl_3$) gas in a proportion of 0.5 to 10.0 volume %, a hydrogen chloride (HCl) gas in a proportion of 0.5 to 3.5 volume %, a carbon dioxide ($CO_2$) gas in a proportion of 0.5 to 5.0 volume %, and a hydrogen sulfide ($H_2S$) gas in a proportion of 0 to 0.5 volume %, and including a hydrogen ($H_2$) gas as a balance, which is flown for the deposition; the deposition temperature from 930 to 1010° C.; and the pressure from 5 to 10 kPa.

Subsequently, if necessary, a second intermediate layer is deposited on the surface of the $Al_2O_3$ layer. The deposition conditions include: the use of a first mixed gas containing, as a mixed gas composition, a titanium tetrachloride ($TiCl_4$) gas in a proportion of 0.1 to 10 volume %, and a nitrogen ($N_2$) gas in a proportion of 1 to 60 volume %, and including a hydrogen ($H_2$) gas as a balance and a second mixed gas containing hydrogen chloride (HCl) in a proportion of 0.5 to 3.0 volume %, and including a hydrogen ($H_2$) gas as a balance, wherein the first mixed gas and the second mixed gas are flown alternately at time intervals of 10 to 60 seconds; the deposition temperature from 855 to 1010° C.; and the pressure from 10 to 85 kPa.

Subsequently, if necessary, an outermost layer is deposited on the surface of the second intermediate layer. The deposition conditions include: the use of only one type of mixed gas containing, as a mixed gas composition, a titanium tetrachloride ($TiCl_4$) gas in a proportion of 0.1 to 10 volume %, and a nitrogen ($N_2$) gas in a proportion of 1 to 60 volume %, and including a hydrogen ($H_2$) gas as a balance, which is flown for the deposition; the deposition temperature from 855 to 1010° C.; and the pressure from 10 to 85 kPa.

Thereafter, if necessary, at least a cutting edge part of the surface of the coating layer formed is subjected to polishing. This polishing can smooth the cutting edge part, and can suppresses the welding of work materials, thereby providing a tool which is further superior in defect resistance.

EXAMPLES

To a WC powder of 5 μm in mean particle size were prepared and added a metal Co powder of 1.5 μm in mean particle size, a TiC powder of 1.0 μm in mean particle size, a NbC powder of 1.0 μm in mean particle size, a ZrC powder of 2.0 μm in mean particle size, and a $Cr_3C_2$ powder of 2.0 μm in mean particle size respectively in proportions of 8 mass %, 0.8 mass %, 3.5 mass %, 0.3 mass %, and 0.6 mass % such that the total of the raw materials accounted for 100 mass %. The resultant mixture was, with the addition of an organic solvent thereto, subjected to mixing and milling, and then further mixing with the addition of a shape retaining agent, and the produced slurry was put into a spray dryer to prepare a granulated powder. Next, with the use of the granulated powder, molding was carried out by press molding into a cutting tool shape (CNMG120408PS), and the molded product was degreased at 450° C. for three hours and then sintered at 1450° C. for one hour in a sintering furnace. In this manner, a cemented carbide was produced.

Subsequently, the cemented carbide was subjected to grinding into a substantially plate shape of CNMG120408PS, and a first TiCN layer having a thickness of 0.5 μm was deposited on the surface of the cemented carbide by a chemical vapor deposition (CVD) method under the initial conditions in such a manner that a first mixed gas containing, as a mixed gas composition, a titanium tetrachloride ($TiCl_4$) gas in a proportion of 2.5 volume % and a nitrogen ($N_2$) gas in a proportion of 23 volume %, and including a hydrogen ($H_2$) gas as a balance and a second mixed gas containing hydrogen chloride (HCl) in a proportion of 2.0 volume % and including a hydrogen ($H_2$) gas as a balance were flown alternately at time intervals of 30 seconds at a deposition temperature of 900° C. and a pressure of 16 kPa.

Subsequently, each of coating films having the constitutions shown in Tables 2 and 3 was formed under the deposition conditions shown in Table 1. The thickness of the first TiCN layer shown is a thickness including 0.5 μm that is the thickness of a TiCN layer into which carbon (C) is diffused under the deposition conditions for TiN. In the deposition of each layer, in the deposition conditions for a case where the first mixed gas and the second mixed gas were flown alternately, the contents of Cl in the respective layers were adjusted by adjusting the period of times of flowing a first mixed gas and the period of times of flowing a second mixed gas. It is to be noted that the thicknesses of the respective layers were confirmed by observing a cross section of the coating layer with a scanning electron microscope.

The cutting tool thus produced was subjected to a GDS analysis (GD-PROFTLER from HORIBA, Ltd.; analysis conditions: power 20 W, Ar pressure 600 Pa, discharge range 2 mmφ, sampling time 0.3 sec/point) for the change in composition in the depth direction from the surface, thereby confirming the distribution of the respective elements of Cl, W and Co in the center of each of the TiCN layer, the (TiAl)CNO layer, the $Al_2O_3$ layer and the TiN layer and the maximum content of Cl in the TiN layer, and the ratios of the contents of the respective elements in the respective layers to the contents of the respective elements in the base and the maximum Cl content ratio in the TiN layer are shown in Tables 2 to 4 (wherein the maximum Cl content ratio is expressed as "Cl maximum" in the tables). In addition, the thicknesses of the respective layers were determined by the observation of a cross section of the cutting tool with a SEM.

Then, the wear resistance and the weld resistance were evaluated by carrying out a cutting test under the following conditions with the use of the cutting tools. The results are shown in Table 4.
Work material: SCM435
Tool shape: CNMG120408PS
Cutting rate: 300 m/min
Feed rate: 0.3 mm/rev
Cut: 2.0 mm (cutting varied for every 3-second cutting)
Cutting time: 15 minutes
Cutting fluid: Emulsion 15%+water 85% mixed fluid
Evaluation item: Observation of a cutting edge with a microscope, and measurement of a flank wear volume which is expressed as "wear volume" in the table.

TABLE 1

| Coating Layer | Mixed Gas Composition (Volume %) | Deposition Temperature (° C.) | Pressure (kPa) |
|---|---|---|---|
| TiCN1 | $TiCl_4$:1.0, $N_2$:10, $CH_3CN$:0.1→0.4, $H_2$:balance HCl:2.5, $H_2$:balance | 850 | 9 |
| TiCN2 | $TiCl_4$:1.0, $N_2$:10, $CH_4$:2.0, $H_2$:balance HCl:2.5, $H_2$:balance | 1010 | 9 |
| TiCN3 | $TiCl_4$:1.0, $N_2$:10, $CH_3CN$:0.1→0.4, $H_2$:balance | 850 | 9 |
| TiCN4 | $TiCl_4$:1.0, $N_2$:10, $CH_3CN$:0.1→0.4, $H_2$:balance HCl:15.0, $H_2$:balance | 850 | 9 |
| TiAlCNO1 | $TiCl_4$:7.0, $N_2$, :5.0, $CH_4$:5.5, CO:0.5, $H_2$:balance HCl:1.5, $H_2$:balance | 1000 | 15 |
| TiAlCNO2 | $TiCl_4$:7.0, $N_2$, :5.0, $CH_4$:5.5, CO:0.5, $H_2$:balance | 1000 | 15 |
| TiAlCNO3 | $TiCl_4$:7.0, $N_2$, :5.0, $CH_4$:5.5, CO:0.5, $H_2$:balance HCl:5.0, $H_2$:balance | 1000 | 15 |
| $Al_2O_3$1 | $AlCl_3$:7.0, HCl:0.5, $CO_2$:1.0, $H_2S$:0.3, $H_2$:balance | 1000 | 10 |
| $Al_2O_3$2 | $AlCl_3$:7.0, HCl:0.5, $CO_2$:1.0, $H_2S$:0.3, $H_2$:balance HCl:2.5, $H_2$:balance | 1000 | 10 |
| $Al_2O_3$3 | $AlCl_3$:7.0, HCl:0.5, $CO_2$:1.0, $H_2S$:0.3, $H_2$:balance HCl:10, $H_2$:balance | 1000 | 10 |
| TiN1 | $TiCl_4$:2.0, $N_2$:44, $H_2$:balance HCl:0.5, $H_2$:balance | 1010 | 80 |
| TiN2 | $TiCl_4$:2.0, $N_2$:44, $H_2$:balance | 1010 | 80 |
| TiN3 | $TiCl_4$:2.0, $N_2$:44, $H_2$:balance HCl:5.0, $H_2$:balance | 1010 | 80 |

TiCN1(MT): The mixed amount of $CH_3CN$ in the mixed gas was changed continuously from 0.1 to 0.4 volume %.
In the cases that the two types of mixed gases having different compositions were used, the two types of mixed gases were flown alternately at time intervals of about 30 seconds.

TABLE 2

Coating Layer (Composition: Thickness (μm)), Content Rate of Each Element[1]

| Sample No. | TiCN Layer | | $Cl_{TiCN}$ | $W_{TiCN}$ | $Co_{TiCN}$ | First Intermediate Layer | $Cl_m$ | $W_m$ | $Co_m$ |
|---|---|---|---|---|---|---|---|---|---|
| 1 | TiCN1:10 | TiCN2:1.0 | 25.20 | 0.16 | 0.10 | (TiAl)CNO1:1.0 | 7.42 | <0.01 | 0.01 |
| 2 | TiCN1:8 | TiCN2:0.5 | 18.83 | 0.21 | 0.08 | (TiAl)CNO1:0.5 | 4.59 | <0.01 | 0.01 |
| 3 | TiCN1:12 | TiCN2:1.2 | 30.10 | 0.18 | 0.15 | (TiAl)CNO1:0.5 | 5.11 | 0.01 | 0.02 |
| 4 | TiCN1:8 | TiCN2:1.0 | 20.04 | 0.19 | 0.22 | (TiAl)CNO1:0.3 | 8.97 | 0.02 | 0.02 |
| 5 | TiCN3:10 | TiCN2:1.0 | 3.82 | 0.09 | 0.28 | (TiAl)CNO1:0.5 | 3.89 | 0.11 | 0.08 |
| 6 | TiCN4:10 | TiCN2:1.0 | 55.18 | 0.18 | 0.10 | (TiAl)CNO1:1.0 | 8.37 | <0.01 | 0.01 |
| 7 | TiCN1:10 | TiCN2:1.0 | 32.12 | 0.20 | 0.13 | (TiAl)CNO2:0.5 | 1.12 | 0.06 | 0.03 |
| 8 | TiCN1:10 | TiCN2:1.0 | 36.27 | 0.22 | 0.15 | (TiAl)CNO3:0.5 | 12.65 | 0.02 | 0.01 |
| 9 | TiCN1:10 | TiCN2:1.0 | 35.42 | 0.28 | 0.22 | (TiAl)CNO1:0.3 | 4.32 | 0.03 | 0.02 |
| 10 | TiCN1:10 | TiCN2:1.0 | 31.21 | 0.19 | 0.05 | (TiAl)CNO1:0.5 | 5.77 | <0.01 | 0.01 |
| 11 | TiCN1:10 | TiCN2:1.0 | 32.33 | 0.22 | 0.03 | (TiAl)CNO1:1 | 5.91 | 0.02 | 0.01 |
| 12 | TiCN1:10 | TiCN2:1.0 | 10.51 | 0.29 | 0.29 | (TiAl)CNO1:0.3 | 4.21 | 0.03 | 0.02 |
| 13 | TiCN1:10 | TiCN2:1.0 | 21.91 | 0.15 | 0.03 | (TiAl)CNO1:0.5 | 3.57 | <0.01 | 0.01 |
| 14 | TiCN1:10 | TiCN2:1.0 | 10.51 | 0.29 | 0.29 | (TiAl)CNO1:1 | 5.22 | 0.02 | 0.01 |
| 15 | TiCN1:10 | TiCN2:1.0 | 25.20 | 0.16 | 0.10 | (TiAl)CNO1:1.0 | 7.42 | <0.01 | 0.01 |
| 16 | TiCN1:8 | TiCN2:0.5 | 18.83 | 0.21 | 0.08 | (TiAl)CNO1:0.5 | 4.59 | <0.01 | <0.01 |

[1] Proportion of Presence of Each Element in Each Layer: content ratio obtained when the proportion of the presence inside the base is regarded as 1

TABLE 3

Coating Layer (Composition: Thickness (μm)), Content Rate of Each Element1)

| Sample No. | $Al_2O_3$ Layer | $Cl_{Al}$ | $W_{Al}$ | $Co_{Al}$ | Second Intermediate Layer | $Cl_n$ | $W_n$ | $Co_n$ |
|---|---|---|---|---|---|---|---|---|
| 1 | $Al_2O_3 1\alpha$:3.0 | 0.38 | <0.01 | <0.01 | TiCN2:0.3 | 8.22 | <0.01 | <0.01 |
| 2 | $Al_2O_3 1\alpha$:3.5 | 0.55 | <0.01 | <0.01 | TiCN2:0.5 | 10.45 | <0.01 | <0.01 |
| 3 | $Al_2O_3 1\alpha$:2.5 | 0.71 | <0.01 | <0.01 | TiCN2:0.2 | 7.43 | <0.01 | <0.01 |
| 4 | $Al_2O_3 1\kappa$:3.0 | 0.88 | <0.01 | <0.01 | TiCN2:0.3 | 4.65 | <0.01 | <0.01 |
| 5 | $Al_2O_3 1\alpha$:3.0 | 0.64 | 0.02 | 0.01 | TiCN2:0.3 | 8.34 | <0.01 | <0.01 |
| 6 | $Al_2O_3 1\alpha$:3.0 | 0.53 | <0.01 | <0.01 | TiCN2:0.3 | 8.45 | <0.01 | <0.01 |
| 7 | $Al_2O_3 1\alpha$:3.0 | 0.63 | 0.01 | 0.01 | TiCN2:0.3 | 6.43 | <0.01 | <0.01 |
| 8 | $Al_2O_3 1\alpha$:3.0 | 0.52 | 0.01 | 0.01 | TiCN2:0.3 | 9.15 | <0.01 | <0.01 |
| 9 | $Al_2O_3 2\alpha$:3.0 | 3.40 | 0.01 | 0.01 | TiCN2:0.3 | 6.82 | <0.01 | <0.01 |
| 10 | $Al_2O_3 1\alpha$:3.0 | 0.69 | 0.01 | 0.01 | TiCN2:0.3 | 2.55 | <0.01 | <0.01 |
| 11 | $Al_2O_3 1\alpha$:3.0 | 0.52 | <0.01 | <0.01 | TiCN2:0.3 | 28.34 | <0.01 | <0.01 |
| 12 | $Al_2O_3 3\alpha$:3.0 | 11.64 | 0.01 | 0.01 | TiCN2:0.2 | 6.65 | <0.01 | <0.01 |
| 13 | $Al_2O_3 1\alpha$:3.0 | 0.69 | 0.01 | 0.01 | TiCN2:0.2 | 7.43 | <0.01 | <0.01 |
| 14 | $Al_2O_3 1\alpha$:3.0 | 0.52 | <0.01 | <0.01 | TiCN2:0.5 | 10.45 | <0.01 | <0.01 |
| 15 | $Al_2O_3 1\alpha$:3.0 | 0.38 | <0.01 | <0.01 | — | | | |
| 16 | $Al_2O_3 1\alpha$:3.5 | 0.55 | <0.01 | <0.01 | — | | | |

1) Proportion of Presence of Each Element in Each Layer: content ratio obtained when the proportion of the presence inside the base is regarded as 1

TABLE 4

| Sample No. | Coating Layer (Composition: Thickness (μm)), Content Rate of Each Element[1] Outermost Layer | $Cl_s$ | $W_s$ | $Co_s$ | Cutting Test Cutting Edge Test | Wear Volume (mm) |
|---|---|---|---|---|---|---|
| 1 | TiCN2:0.1 | 8.22 | <0.01 | <0.01 | Normal | 0.10 |
| 2 | TiCN2:0.2 | 10.45 | <0.01 | <0.01 | Normal | 0.12 |
| 3 | TiCN2:0.2 | 7.43 | <0.01 | <0.01 | Normal | 0.11 |
| 4 | TiCN2:0.1 | 4.65 | <0.01 | <0.01 | Wearing | 0.15 |
| 5 | TiCN2:0.2 | 8.34 | <0.01 | <0.01 | Welding Increased | 0.28 |
| 6 | TiCN2:0.2 | 8.45 | <0.01 | <0.01 | Wearing Increased | 0.25 |
| 7 | TiCN2:0.2 | 6.43 | <0.01 | <0.01 | Welding Increased | 0.20 |
| 8 | TiCN2:0.2 | 9.15 | <0.01 | <0.01 | Wearing Increased | 0.19 |
| 9 | TiCN2:0.2 | 6.82 | <0.01 | <0.01 | Wearing Increased | 0.25 |
| 10 | TiCN2:0.2 | 2.55 | <0.01 | <0.01 | Welding Increased | 0.21 |
| 11 | TiCN2:0.2 | 28.34 | <0.01 | <0.01 | Wearing Increased | 0.20 |
| 12 | TiCN2:0.2 | 6.65 | <0.01 | <0.01 | Welding Increased Wearing Increased | 0.38 |
| 13 | TiCN2:0.2 | 7.43 | <0.01 | <0.01 | Welding Increased Wearing Increased | 0.41 |
| 14 | TiCN2:0.2 | 10.45 | <0.01 | <0.01 | Welding Increased Wearing Increased | 0.42 |
| 15 | TiN1:0.3 TiN2:0.2 | 4.85 | <0.01 | <0.01 | Normal | 0.17 |
| 16 | TiN1:0.5 TiN2:0.2 | 1.55 | <0.01 | <0.01 | Normal | 0.18 |

[1] Proportion of Presence of Each Element in Each Layer: ratio obtained when the proportion of the presence inside the base is regarded as 1

From the results shown in Tables 1 to 4, it was found that, in the case of sample Nos. 5 and 14 in each of which the Cl content in a TiCN layer was smaller than that in an outermost layer and sample Nos. 12 and 13 in each of which the Cl content in the outermost layer was smaller than that in an Al$_2$O$_3$ layer, the components of the work material were welded and therefore the number of shocks was decreased or wear resistance was deteriorated.

On the contrary, in the case of sample Nos. 1 to 4, 6 to 11, 15 and 16 in each of which the Cl content in a first TiCN layer was larger than that in an outermost layer and the Cl content in the outermost layer was larger than that in an Al$_2$O$_3$ layer, the weld resistance of a coating layer was high and cutting performance including excellent wear resistance was achieved. Particularly in the case of sample Nos. 1 to 4, 7, 8, 15 and 16 in each of which a TiCN layer, an Al$_2$O$_3$ layer and an outermost layer were laminated in this order and the ratios of the contents of Cl in the respective layers to the content of Cl in a base were $10 \leq Cl_{TiCN} \leq 50$, $0.3 \leq Cl_{Al} \leq 2$ and $2 \leq Cl_S \leq 9.5$ in the GDS analysis, the wear resistance of the coating layer was high and cutting performance including excellent wear resistance was achieved. Among these samples, particularly in sample Nos. 1 to 4, 15 and 16 in each of which $2 \leq Cl_m \leq 9.5$, particularly the weld resistance of a coating layer was high and cutting performance including excellent wear resistance was achieved. In the case of sample Nos. 1 to 4 each having a second intermediate layer, the wear volume was small. Among these samples, sample Nos. 1 to 3 each meeting the requirement: $5 \leq Cl_n \leq 25$ showed small wear volumes.

REFERENCE SIGNS LIST

1: base (cemented carbide)
2: TiCN layer
  2a: first TiCN layer
  2b: second TiCN layer
3: first intermediate layer
4: Al$_2$O$_3$ layer
5: second intermediate layer
6: outermost layer
7: coating layer
8: cutting tool

The invention claimed is:

1. A cutting tool comprising:
a base including a hard alloy; and
a coating layer located on a surface of the base,
wherein the coating layer comprises
  at least one TiCN layer formed from Ti($C_{x1}N_{y1}O_{z1}$) ($0<x1\leq1$, $0<y1\leq1$, $0\leq z1\leq1$, $x1+y1+z1=1$);
  an Al$_2$O$_3$ layer; and
  an outermost layer formed from Ti($C_{x2}N_{y2}O_{z2}$) ($0\leq x2\leq1$, $0\leq y2\leq1$, $0\leq z2\leq1$, $x2+y2+z2=1$),
  which are laminated in order from a side of the base, and a content of Cl at a thickness-center position of the TiCN layer is higher than a content of Cl at a thickness-center position of the outermost layer and the content of Cl at the thickness-center position of the outermost layer is higher than a content of Cl at a thickness-center position of the Al$_2$O$_3$ layer in a glow-discharge emission spectrometry (GDS analysis).

2. The cutting tool according to claim 1, wherein, when the ratios of the contents of Cl in the thickness-center positions of the respective layers of the TiCN layer, the Al$_2$O$_3$ layer and the outermost layer to the content of Cl in the base are respectively represented by $Cl_{TiCN}$, $Cl_{Al}$ and $Cl_S$, the following requirements are met: $10 \leq Cl_{TiCN} \leq 50$; $0.3 \leq Cl_{Al} \leq 2$; and $2 \leq Cl_S \leq 9.5$.

3. The cutting tool according to claim 1, wherein, when the ratios of the contents of W and Co in the respective layers of the TiCN layer, the Al$_2$O$_3$ layer and the outermost layer to the contents of W and Co in the base are respectively represented by $W_{TiCN}$, $W_{Al}$, $W_s$, $Co_{TiCN}$, $Co_{Al}$ and $Co_s$, the following requirements are met: $0.05 \leq W_{TiCN} \leq 0.3$; $W_{Al} \leq 0.01$; $W_S \leq 0.01$; $0.05 \leq Co_{TiCN} \leq 0.3$; $Co_{Al} \leq 0.01$; and $Co_S \leq 0.01$.

4. The cutting tool according to claim 1, wherein a first intermediate layer formed from (Ti,Al)($C_{x3}N_{y3}O_{z3}$) ($0\leq x3\leq1$, $0\leq y3\leq1$, $0\leq z3\leq1$, $x3+y3+z3=1$) is located between the TiCN layer and the Al$_2$O$_3$ layer.

5. The cutting tool according to claim 4, wherein, when the ratio of the content of Cl in the first intermediate layer to the content of Cl in the base is represented by $Cl_m$, the following requirement is met: $2 \leq Cl_m \leq 9.5$.

6. The cutting tool according to claim 4, wherein, when the ratios of the contents of W and Co in the first intermediate layer to the contents of W and Co in the base are respectively represented by $W_m$ and $Co_m$, the following requirements are met: $W_m \leq 0.05$; and $Co_m \leq 0.05$.

7. The cutting tool according to claim 1, wherein a second intermediate layer formed from (Ti,Al)($C_{x4}N_{y4}O_{z4}$) ($0\leq x4\leq1$, $0\leq y4\leq1$, $0\leq z4\leq1$, $x4+y4+z4=1$) and having a high Cl content is located between the Al$_2$O$_3$ layer and the outermost layer.

8. The cutting tool according to claim 7, wherein, when the ratio of the content of Cl in the second intermediate layer to the content of Cl in the base is represented by $Cl_n$, the following requirement is met: $5 \leq Cl_n \leq 25$.

9. The cutting tool according to claim 7, wherein the ratios of the contents of W and Co in the second intermediate layer to the contents of W and Co in the base are respectively represented by $W_n$ and $Co_n$, the following requirements are met: $W_n \leq 0.05$; and $Co_n \leq 0.05$.

* * * * *